US010263584B1

(12) United States Patent
Das et al.

(10) Patent No.: US 10,263,584 B1
(45) Date of Patent: *Apr. 16, 2019

(54) CALIBRATION OF A DUAL-PATH PULSE WIDTH MODULATION SYSTEM

(71) Applicant: Cirrus Logic International Semiconductor Ltd., Edinburgh (GB)

(72) Inventors: Tejasvi Das, Austin, TX (US); Alan Mark Morton, Austin, TX (US); Xin Zhao, Austin, TX (US); Lei Zhu, Austin, TX (US); Xiaofan Fei, Austin, TX (US); Johann G. Gaboriau, Austin, TX (US); John L. Melanson, Austin, TX (US); Amar Vellanki, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/133,045

(22) Filed: Sep. 17, 2018

Related U.S. Application Data

(63) Continuation-in-part of application No. 15/927,691, filed on Mar. 21, 2018.

(60) Provisional application No. 62/573,514, filed on Oct. 17, 2017.

(51) Int. Cl.
*H03G 3/30* (2006.01)
*H03F 3/187* (2006.01)
*H04R 3/00* (2006.01)
*H03K 17/687* (2006.01)

(52) U.S. Cl.
CPC ........... *H03G 3/3005* (2013.01); *H03F 3/187* (2013.01); *H04R 3/00* (2013.01); *H03F 2200/03* (2013.01); *H03F 2200/264* (2013.01); *H03F 2200/351* (2013.01); *H03K 17/6872* (2013.01)

(58) Field of Classification Search
CPC ........... H03K 7/08; G06F 1/025; H02M 3/157
See application file for complete search history.

(56) References Cited

U.S. PATENT DOCUMENTS 9,762,255 B1    9/2017   Satoskar et al.
2011/0012674 A1  1/2011   Midya et al.
2012/0188111 A1  7/2012   Ledzius et al.

FOREIGN PATENT DOCUMENTS

WO    2016/069319 A1    5/2016

OTHER PUBLICATIONS

Lu et al., "A 5V Output Voltage Boost Switching Converter with Hybrid Digital and Analog PWM Control", 2010 ACM/IEEE International Symposium on Low-Power Electronics and Design (ISLPED), 2010.

(Continued)

*Primary Examiner* — Vineeta S Panwalkar
(74) *Attorney, Agent, or Firm* — Jackson Walker L.L.P.

(57) ABSTRACT

A system may include a digital pulse width modulator subsystem, a first path coupled to an output of the digital pulse width modulator subsystem, a second path coupled to the output of the digital pulse width modulator subsystem and configured to drive a closed-loop analog pulse width modulator, a controller to select between the first path and the second path for processing a signal based on one or more characteristics of the signal, wherein a first gain of the first path and a second gain of the second path are approximately equal at the time of switching selection between the first path and the second path or vice versa, in order to minimize artifacts due to the switching.

29 Claims, 9 Drawing Sheets

(56) References Cited

OTHER PUBLICATIONS

International Search Report and Written Opinion of the International Searching Authority, International Application No. PCT/US2018/054186, dated Jan. 22, 2019.

CALIBRATION OF A DUAL-PATH PULSE WIDTH MODULATION SYSTEM

RELATED APPLICATION

The present disclosure claims priority to U.S. Provisional Patent Application Ser. No. 62/573,514, filed Oct. 17, 2017, which is incorporated by reference herein in its entirety, and claims priority as a continuation-in-part application to U.S. Provisional patent application Ser. No. 15/927,691, filed Mar. 21, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop PWM amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either an open-loop mode (e.g. using a class-D open-loop driver) or a closed-loop mode (e.g., using a closed-loop driver) depending on the specific application may be desirable. The open-loop mode may advantageously consume less power than the closed-loop mode, with the disadvantage that signal distortion in the open-loop mode may increase as signal magnitude of the signal to be amplified by the open-loop path increases. Thus, as a signal envelope increases, it may be desirable to switch to the closed-loop mode due to the high distortion levels in the open-loop path, with the trade-off of higher power consumption in the closed-loop path.

When using such a single PWM amplifier circuit, perceptible audio artifacts may occur when switching between open-loop operation and closed-loop operation, and thus, it may be desirable to reduce or eliminate such audio artifacts.

SUMMARY

In accordance with the teachings of the present disclosure, one or more disadvantages and problems associated with existing approaches to processing signals with an amplifier may be reduced or eliminated.

In accordance with embodiments of the present disclosure, a system may include a digital pulse width modulator subsystem, a first path coupled to an output of the digital pulse width modulator subsystem, a second path coupled to the output of the digital pulse width modulator subsystem and configured to drive a closed-loop analog pulse width modulator, a controller to select between the first path and the second path for processing a signal based on one or more characteristics of the signal, wherein a first gain of the first path and a second gain of the second path are approximately equal at the time of switching selection between the first path and the second path or vice versa, in order to minimize artifacts due to the switching.

In accordance with these and other embodiments of the present disclosure, a method may be provided for use in a system comprising a digital pulse width modulator subsystem, a first path coupled to an output of the digital pulse width modulator subsystem and configured to drive an open-loop driver stage, and a second path coupled to the output of the digital pulse width modulator subsystem and configured to drive a closed-loop analog pulse width modulator, wherein one of the first path and the second path is selected for processing a signal based on one or more characteristics of the signal. The method may comprise causing a first gain of the first path and a second gain of the second path to be approximately equal at the time of switching selection between the first path and the second path or vice versa, in order to minimize artifacts due to the switching.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
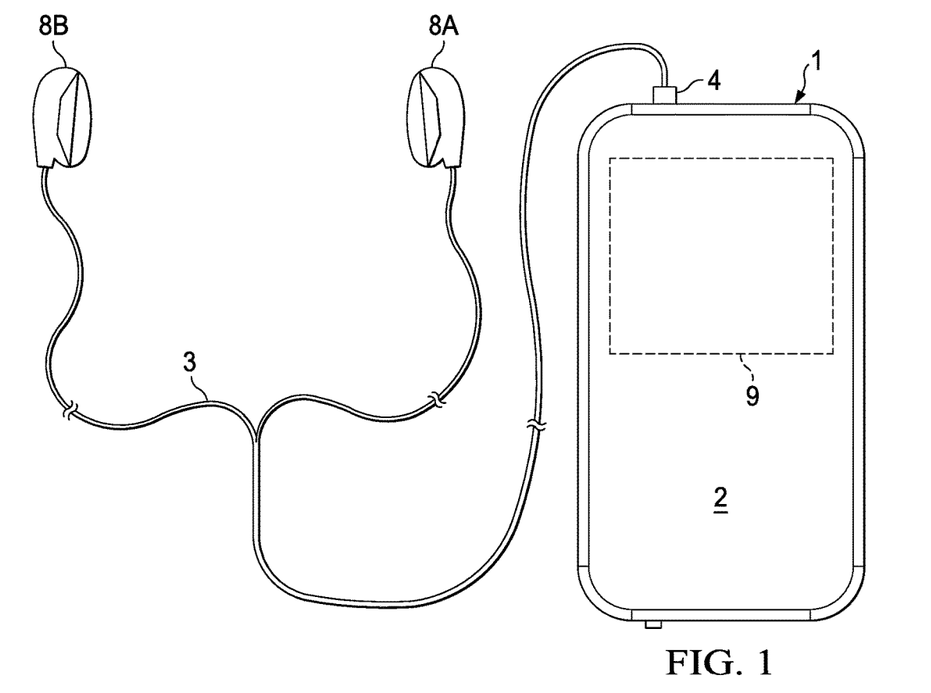
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
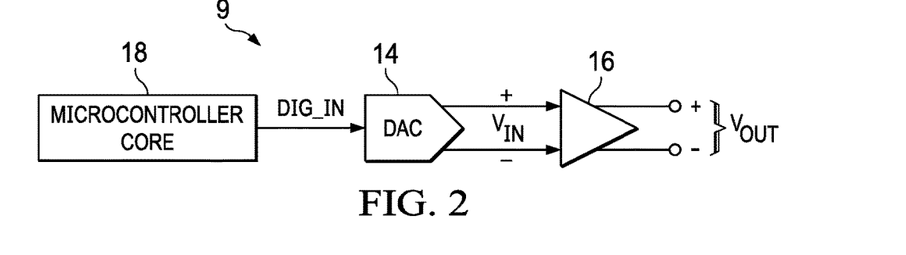
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
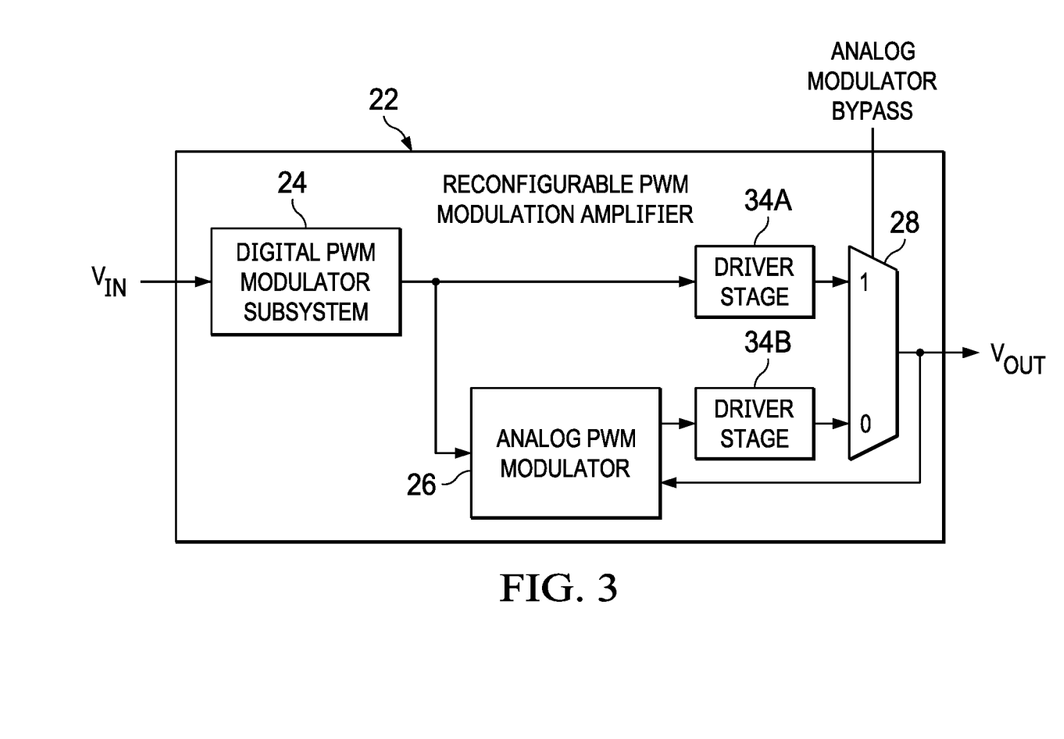
FIG. 3 is a block diagram of selected components of an example reconfigurable PWM modulator, in accordance with embodiments of the present disclosure.

FIG. 3 is a block diagram of selected components of an example pulse width modulation amplifier 22, in accordance with embodiments of the present disclosure. In some embodiments, example pulse width modulation amplifier 22 may be used to implement amplifier 16 of FIG. 2. As shown in FIG. 3, example pulse width modulation amplifier 22 may include a digital PWM modulator subsystem 24 and an analog PWM modulator 26, along with a direct bypass function implemented with a multiplexer 28.

Reconfigurable PWM modulation amplifier 22 may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulation amplifier 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulation amplifier 22 from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control circuit (not shown) may be used to control multiplexer 28 in order to select a signal processing path for reconfigurable PWM modulation amplifier 22. For example, selection of such multiplexer control signal may be based on one or more characteristics of input signal $V_{IN}$ to the amplifier (e.g., signal magnitude, signal peak, signal envelope, signal frequency, or other characteristic of input signal $V_{IN}$). Thus, reconfigurable PWM modulation amplifier 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal (e.g., signal magnitude, signal peak, signal envelope, signal frequency, or other characteristic of input signal $V_{IN}$). In embodiments in which input signal $V_{IN}$ is an audio signal, selection of the path for processing may be based not only on characteristics of the audio signal within an audible band of frequencies, but also the characteristics of out-of-band components of the signal that propagate to output signal $V_{OUT}$.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. Switching between the analog closed-loop path and the digital open-loop path may be triggered by an appropriate criteria, including without limitation signal magnitude, signal frequency, power consumption of reconfigurable PWM modulation amplifier 22, and/or distortion present in the signal. However, the foregoing system may be susceptible to perceptible audio artifacts, such as "pops" and "clicks," unless steps are taken to reduce or avoid such artifacts. Accordingly, as described in greater detail below with respect to FIGS. 4-6, reconfigurable PWM modulation amplifier 22 may include a calibration subsystem configured to calibrate at least one of a first gain of a first path (open-loop path of digital PWM modulator subsystem 24 and driver stage 34A) and a second gain of a second path (closed-loop path of analog PWM modulator 26) in order that the first gain and the second gain are approximately equal at the time of switching selection between the first path and the second path or vice versa, in order to minimize perceptible audio artifacts due to the switching.

Figure 4:
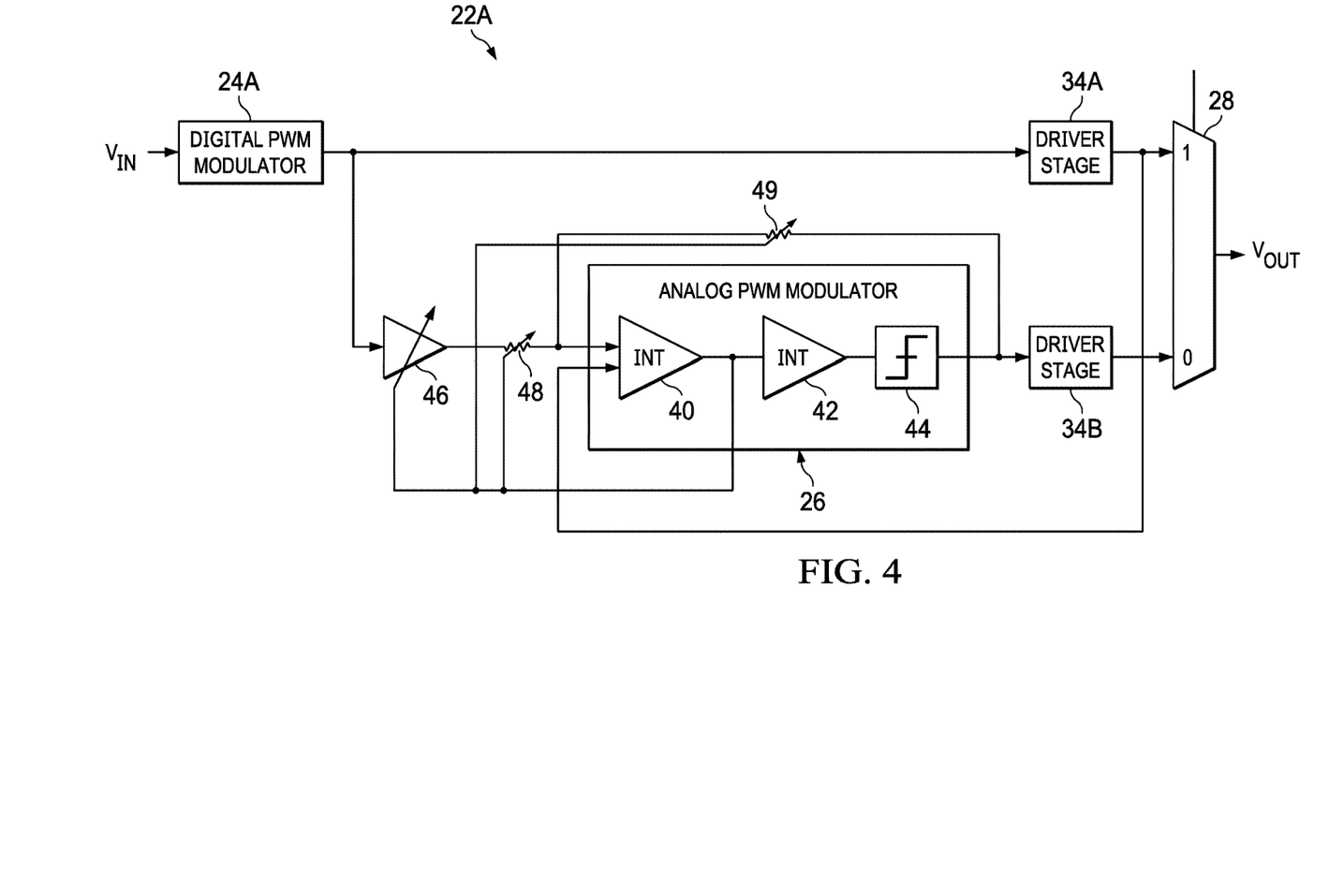
FIG. 4 is a block diagram of selected components of an example reconfigurable PWM modulator, including components for calibrating path gains, in accordance with embodiments of the present disclosure.

FIG. 4 is a block diagram of selected components of an example reconfigurable PWM modulation amplifier 22A, in accordance with embodiments of the present disclosure. In some embodiments, reconfigurable PWM modulation amplifier 22A may be used to implement reconfigurable PWM modulation amplifier 22 of FIG. 3. As shown in FIG. 4, a single digital PWM modulator 24A may be used to implement digital PWM modulator subsystem 24, and analog PWM modulator 26 may include a first-stage integrator 40 followed by one or more additional stage integrators 42, which are in turn followed by a quantizer 44 that may generate an analog PWM signal to driver stage 34B. A buffer 46 may be interfaced between digital PWM modulator 24A and analog PWM modulator 26 to buffer a digital PWM signal generated by digital PWM modulator 24A to the input of analog PWM modulator 26. Gain resistors 48 and 49 may also be present to define a gain of analog PWM modulator 26.

As shown in FIG. 4, the gain of buffer 46, gain resistor 48, and/or gain resistor 49 may be variable. When calibration is enabled, first-stage integrator 40 of analog PWM modulator 26 may be re-used as a filter and comparator combination for detecting a gain of the open-loop path including driver stage 34A. Because one input to the comparator implemented using first-stage integrator 40 is the digital signal generated by digital PWM modulator 24A (or in alternative embodiments, the input signal to digital PWM modulator 24A) and the other input to the comparator implemented using first-stage integrator 40 is the output of driver stage 34A, the output of first-stage integrator 40, when calibration is enabled, is indicative of the gain of the open-loop path. Such detected gain may then be used to appropriately set a gain of buffer 46, a resistance of gain resistor 48, and/or a resistance of gain resistor 49, so as to match the gain of the closed-loop path including analog PWM modulator 26 to the gain of the open-loop path.

Figure 5:
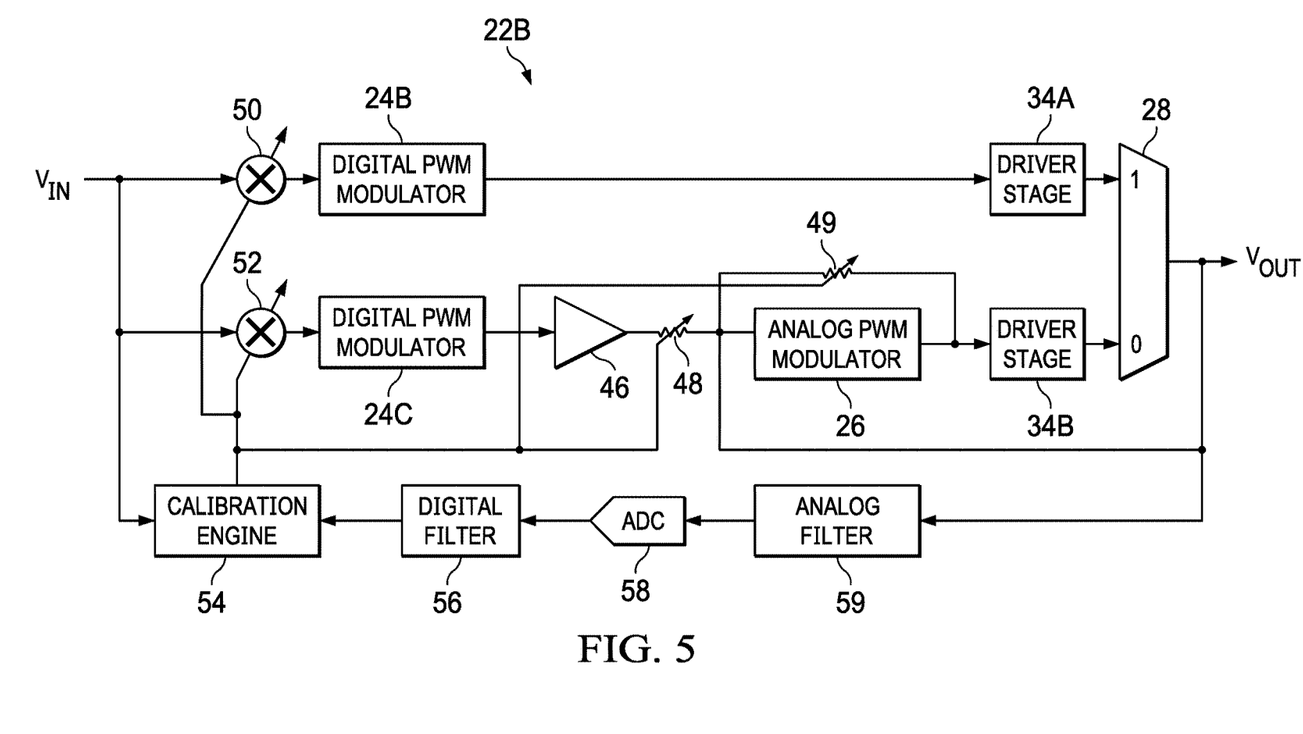
FIG. 5 is a block diagram of selected components of another example reconfigurable PWM modulator, including components for calibrating path gains, in accordance with embodiments of the present disclosure.

FIG. 5 is a block diagram of selected components of an example reconfigurable PWM modulation amplifier 22B, in accordance with embodiments of the present disclosure. In some embodiments, reconfigurable PWM modulation amplifier 22B may be used to implement reconfigurable PWM modulation amplifier 22 of FIG. 3. As shown in FIG. 5, digital PWM modulation subsystem 24 of FIG. 2 may be implemented using a first digital PWM modulator 24B and a second digital PWM modulator subsystem 24C. Digital PWM modulator 24B may drive open-loop driver stage 34A while digital PWM modulator 24C may drive analog PWM modulator 26 via a buffer 46 configured to buffer a digital PWM signal generated by digital PWM modulator 24C to the input of analog PWM modulator 26. Gain resistors 48 and 49 may also be present to define a gain of analog PWM modulator 26.

Also as shown in FIG. 5, a gain element 50 may interface between the input to reconfigurable PWM modulation amplifier 22B and digital PWM modulator 24B and a gain element 52 may interface between the input to reconfigurable PWM modulation amplifier 22B and digital PWM modulator 24C. Gain element 50 may apply a coarse gain setting to the open-loop path while gain element 52 may apply a smaller fine gain setting to the closed-loop path. A calibration engine 54 may detect output signal $V_{OUT}$ as filtered by an analog filter 59, converted from the analog domain to the digital domain by ADC 58, and filtered by digital filter 56. Such filtering may ensure that calibration is performed based only upon in-band signal content. Calibration engine 54 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 54, and the input signal and output signal $V_{OUT}$ may also be delay-matched to properly measure gain. Based on the determined gain, calibration engine 54 may calibrate gain element 50 and/or gain element 52 in the digital domain prior to digital modulation such that the open-loop path and closed-loop path have the same path gain. In some embodiments, calibration engine 54 may also be able to vary a resistance of gain resistor 48 and/or a resistance of gain resistor 49 in order to calibrate gains of the open-loop path and the closed-loop path.

In operation, the calibration system shown in FIG. 5 may calibrate on actual playback content represented by the input signal or based on an inaudible pilot tone which may be used only for calibration.

Figure 6:
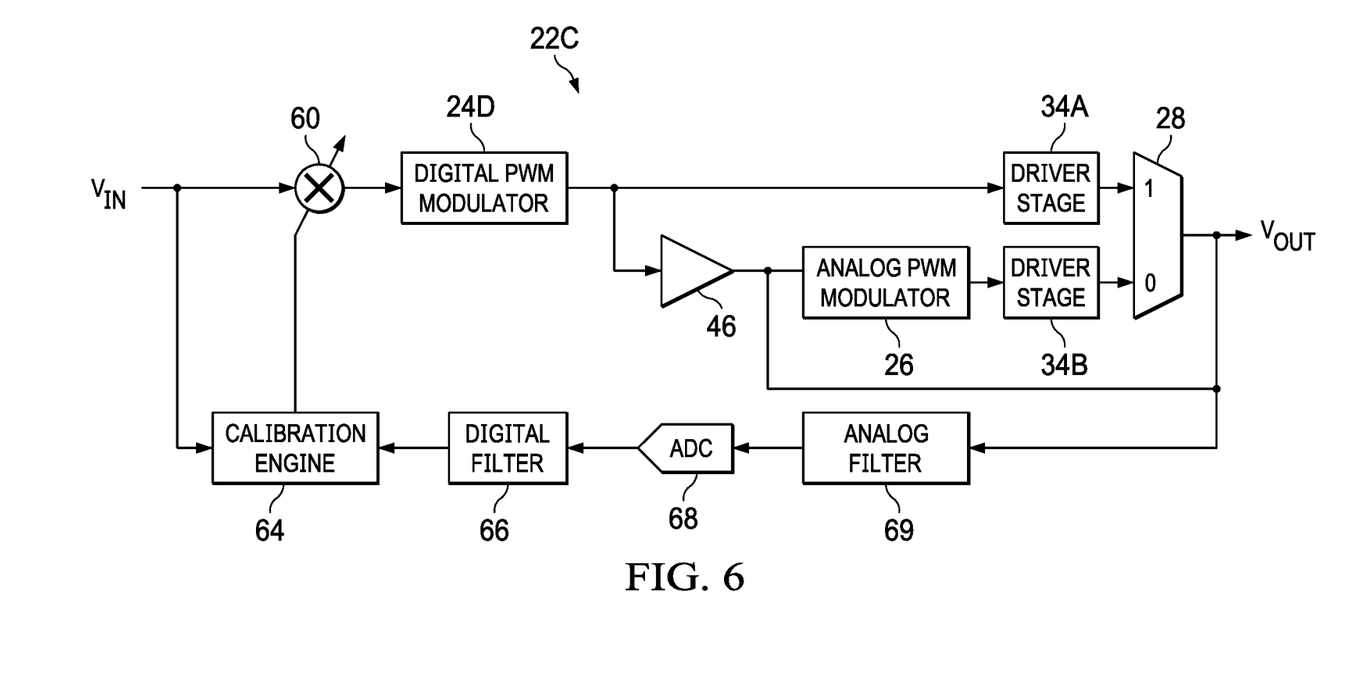
FIG. 6 is a block diagram of selected components of another example reconfigurable PWM modulator, including components for calibrating path gains, in accordance with embodiments of the present disclosure.

FIG. 6 is a block diagram of selected components of an example reconfigurable PWM modulation amplifier 22C, in accordance with embodiments of the present disclosure. In some embodiments, reconfigurable PWM modulation amplifier 22C may be used to implement reconfigurable PWM modulation amplifier 22 of FIG. 3. As shown in FIG. 6, digital PWM modulation subsystem 24 of FIG. 2 may be implemented using a single digital PWM modulator 24D. Digital PWM modulator 24D may drive open-loop driver stage 34A while digital PWM modulator 24D may drive analog PWM modulator 26 via a buffer 46 configured to buffer a digital PWM signal generated by digital PWM modulator 24D to the input of analog PWM modulator 26.

Also as shown in FIG. 6, a gain element 60 may interface between the input to reconfigurable PWM modulation amplifier 22C and digital PWM modulator 24D. Gain element 60 may apply a variable gain to the input signal before modulation by PWM modulation amplifier 22C. A calibration engine 64 may detect output signal $V_{OUT}$ as filtered by an analog filter 69, converted from the analog domain to the digital domain by ADC 68, and filtered by digital filter 66. Such filtering may ensure that calibration is performed based only upon in-band signal content. Calibration engine 64 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 64, and the input signal and output signal $V_{OUT}$ may also be delay-matched to properly measure gain. Based on the determined gain, calibration engine 64 may calibrate gain element 60 in the digital domain prior to digital modulation such that the open-loop path and closed-loop path have the same path gain.

The gain calibration performed in accordance herein may ensure that a first gain of the open-loop path and a second gain of the closed-loop path are approximately equal at the time of switching selection between the open-loop path and the closed-loop path or vice versa, in order to minimize artifacts due to the switching. In addition, at the time of such switching, a difference between noise floors of the two paths may be small enough to minimize artifacts due to the switching.

The gain calibration performed in accordance herein may be undertaken at any suitable time. For example, in some embodiments, the calibration subsystem disclosed herein may be configured to calibrate gain during product testing of reconfigurable PWM modulation amplifier 22 or a device in which reconfigurable PWM modulation amplifier 22 resides, such that the calibration is performed once prior to its end use. As another example, the calibration subsystem disclosed herein may be configured to calibrate gain in real-time while audio content of the input signal is being played back. As a specific example of real-time calibration, as depicted in FIGS. 5 and 6, a calibration subsystem may be configured to, when the open-loop path is selected, detect an output of the open-loop path in order to calibrate gain.

In these and other embodiments, the calibration subsystem may be configured to perform calibration in a series of steps while audio content of the input signal is being played back in order to minimize user perceptible audio artifacts. For example, if the calibration subsystem determines that a gain should be changed by a factor of x, the calibration subsystem may change the gain in a series of y steps, wherein during each step, gain is changed by an amount x/y. In some of such embodiments, the calibration subsystem is further configured to transition between consecutive steps of the series of steps at one of a zero crossing of the input signal and a zero crossing of a pulse width modulation signal derived from the input signal within the system.

In these and other embodiments, the calibration subsystem may be further configured to receive a temperature signal indicative of a temperature associated with reconfigurable PWM modulation amplifier 22 (e.g., from a temperature sensor, not shown) and calibrate gain by applying a correction factor to one or more of the path gains.

In these and other embodiments, the calibration subsystem may be enabled to perform calibration at intermittent periods. For example, the calibration subsystem may perform calibration for a period of time and cease calibrating for another period of time before again calibrating. As another example, the calibration subsystem may enable calibration of at least one of the first gain and the second gain in response to a change in the temperature.

In these and other embodiments, the calibration subsystem may further be configured to enable gain calibration only if an input signal (e.g., an input signal to reconfigurable PWM modulator) is above a threshold magnitude. In such embodiments, the calibration subsystem further may be configured to abort gain if the input signal falls below the threshold magnitude during a calibration process.

In these and other embodiments, the calibration subsystem may further be configured to enable gain calibration only if the open-loop path is selected for processing. In such embodiments, the calibration subsystem may further be configured to abort gain calibration if the closed-loop path is selected for processing at any time during the calibration process.

In these and other embodiments, the calibration subsystem may further be configured to modify one or more responses of the open-loop path or the closed-loop path or both paths such that the frequency responses of the open-loop path and the closed-loop path are approximately matched at the time of switching. Such modification may include modifying characteristics of one or more filters (not explicitly shown) in one or both of the open-loop path and the closed-loop path in order to appropriately match the frequency responses of the paths.

Figure 7:
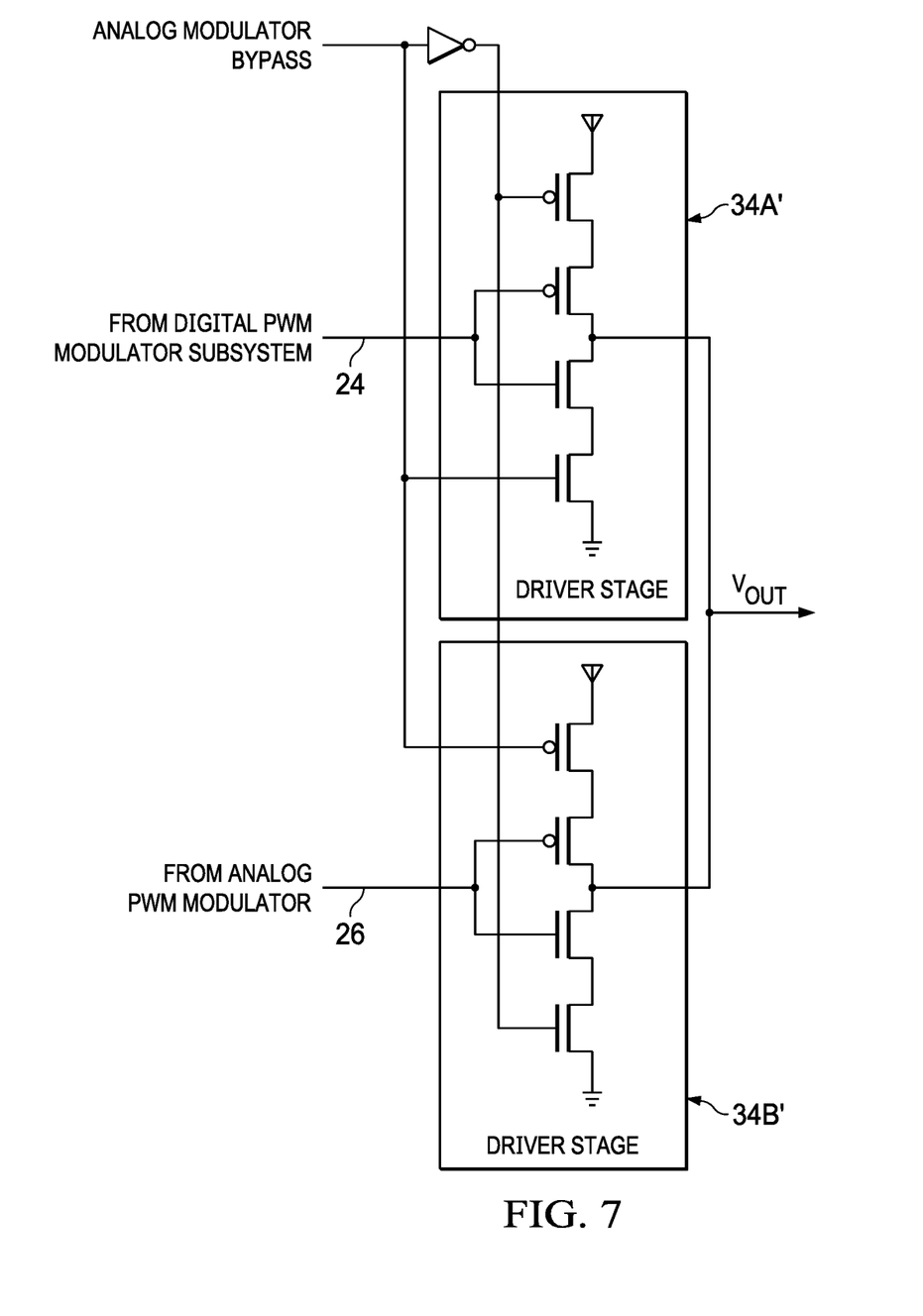
FIG. 7 is a block diagram depicting tri-stated driver stages which may be used in lieu of an output multiplexer in a reconfigurable PWM modulator, in accordance with embodiments of the present disclosure.

Although FIGS. 3-6 depict multiplexer 28 configured to select between passing the output of driver stage 34A and passing the output of driver stage 34B as output signal $V_{OUT}$, those of skill in the art will recognize that any other suitable circuit, system, device, or apparatus may be used in addition to or in lieu of multiplexer 28 in order to select between passing the output of driver stage 34A and passing the output of driver stage 34B as output signal $V_{OUT}$. As a non-limiting example, FIG. 7 is a block diagram depicting examples of tri-stated driver stages 34A' and 34B' in lieu of driver stages 34A and 34B, respectively.

Tri-stated driver stages 34A' and 34B', by nature of being tri-stated and having their respective outputs as wired-OR outputs, may perform the logical function of multiplexer 28 while dispensing with the need for multiplexer 28. As shown in FIG. 7, reconfigurable PWM modulation amplifier 22 may be configured to operate in the analog closed-loop mode through the use of analog PWM modulator 26 when the ANALOG MODULATOR BYPASS control signal is deasserted, thus disabling driver stage 34A' and enabling 34B' to drive output signal $V_{OUT}$. Likewise, reconfigurable PWM modulation amplifier 22 may be configured to operate in the digital open-loop mode through the use of digital PWM modulator subsystem 24 when the ANALOG MODULATOR BYPASS control signal is asserted, thus disabling driver stage 34B' and enabling 34A' to drive output signal $V_{OUT}$.

Figure 8:
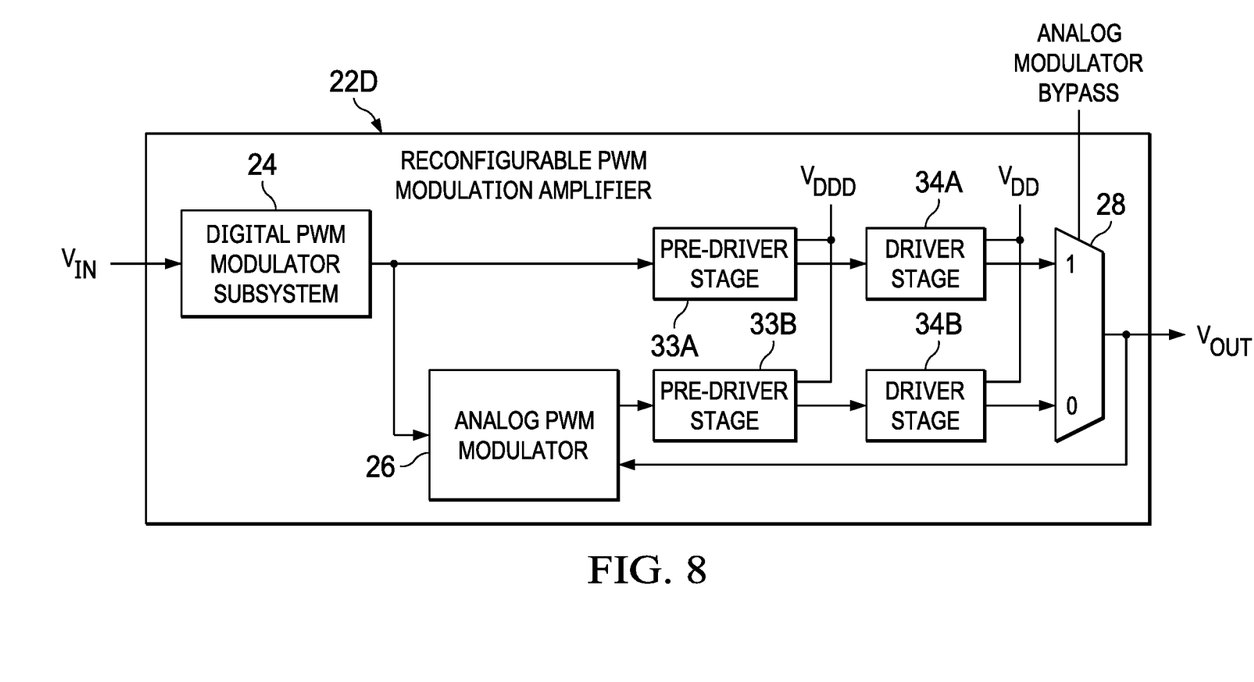
FIG. 8 is a block diagram of selected components of another example reconfigurable PWM modulator, in accordance with embodiments of the present disclosure.

In addition, although FIGS. 3-6 depict particular architectures for reconfigurable PWM modulation amplifier 22, many other suitable architectures may be used that implement similar or equivalent functionality to the architectures shown in one or more of FIGS. 3-6. As a non-limiting example, FIG. 8 depicts a reconfigurable PWM modulation amplifier 22D (which may be used to implement reconfigurable PWM modulation amplifier 22 of FIG. 3) which may be similar in many material respects to reconfigurable PWM modulation amplifier 22 depicted in FIG. 3, except that reconfigurable PWM modulation amplifier 22D includes a pre-driver stage 33A configured to receive the output of digital PWM modulator subsystem 24 and drive an associated pre-driver signal to driver stage 34A, and reconfigurable PWM modulation amplifier 22D also includes a pre-driver stage 33B configured to receive the output of digital PWM modulator subsystem 24 and drive an associated pre-driver signal to driver stage 34B. In some embodiments, pre-driver stages 33A and 33B may be powered from the same power supply that powers driver stages 34A and 34B. However, in other embodiments, pre-driver stages 33A and 33B may be powered from a different power supply (e.g., a power supply providing voltage $V_{DDD}$) than that which powers driver stages 34A and 34B (e.g., a power supply providing voltage $V_{DD}$). Such use of different power supplies may maximize power efficiency of reconfigurable PWM modulation amplifier 22D. In some embodiments, reconfigurable PWM modulation amplifiers 22A-C shown in FIGS. 4-6 may be adapted in a manner consistent with reconfigurable PWM modulation amplifier 22D.

Figure 9:
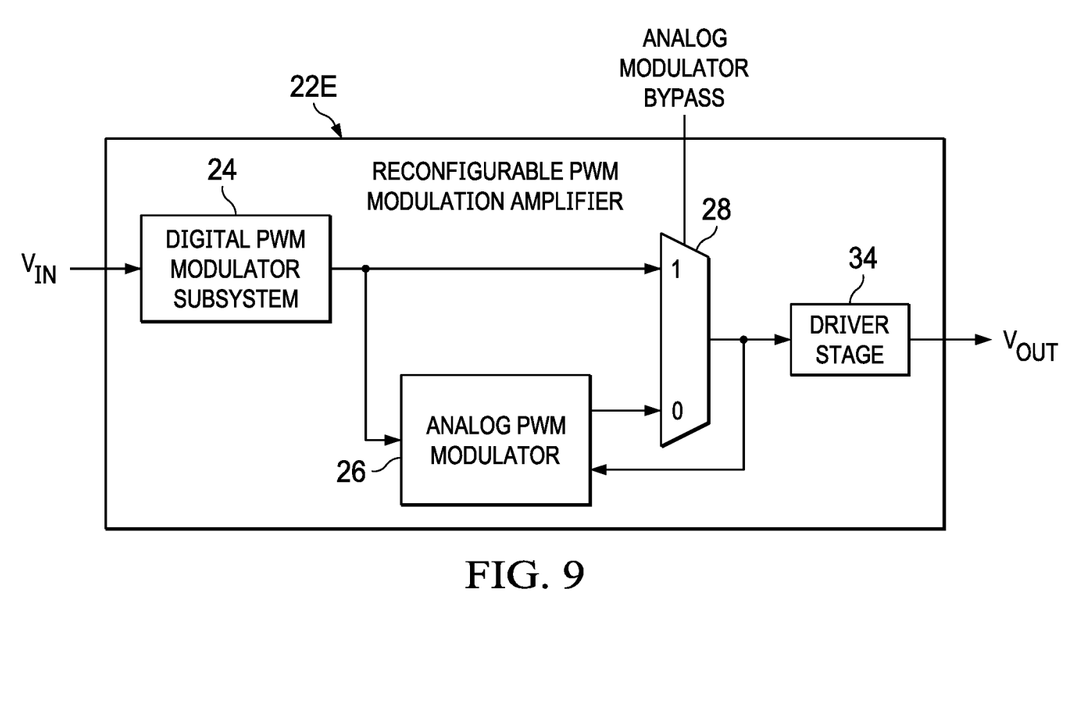
FIG. 9 is a block diagram of selected components of another reconfigurable PWM modulator, in accordance with embodiments of the present disclosure.

As another non-limiting example, FIG. 9 depicts a reconfigurable PWM modulation amplifier 22E (which may be used to implement reconfigurable PWM modulation amplifier 22 of FIG. 3) which may be similar in many material respects to reconfigurable PWM modulation amplifier 22 depicted in FIG. 3, except that reconfigurable PWM modulation amplifier 22E includes a common driver stage 34 in lieu of separate driver stages 34A and 34B, and multiplexer 28 may select between the closed-loop mode (using analog PWM modulator 26) and the open-loop mode (bypassing analog PWM modulator 26) in the signal path prior to common driver stage 34, and common driver stage 34 may drive the signal passed by multiplexer 28 as output signal $V_{OUT}$. Thus, taken together, reconfigurable PWM modulation amplifier 22 of FIG. 3 and reconfigurable PWM modulation amplifier 22E of FIG. 9 underscore that selection between the open-loop mode and the closed-loop mode may be made at any suitable point in the signal path of reconfigurable PWM modulation amplifier 22, and the architecture of reconfigurable PWM modulation amplifier 22 may be adapted to account for the point in the signal path in which the selection is made. In some embodiments, reconfigurable PWM modulation amplifiers 22A-C shown in FIGS. 4-6 may be adapted in a manner consistent with reconfigurable PWM modulation amplifier 22E.

Figure 10:
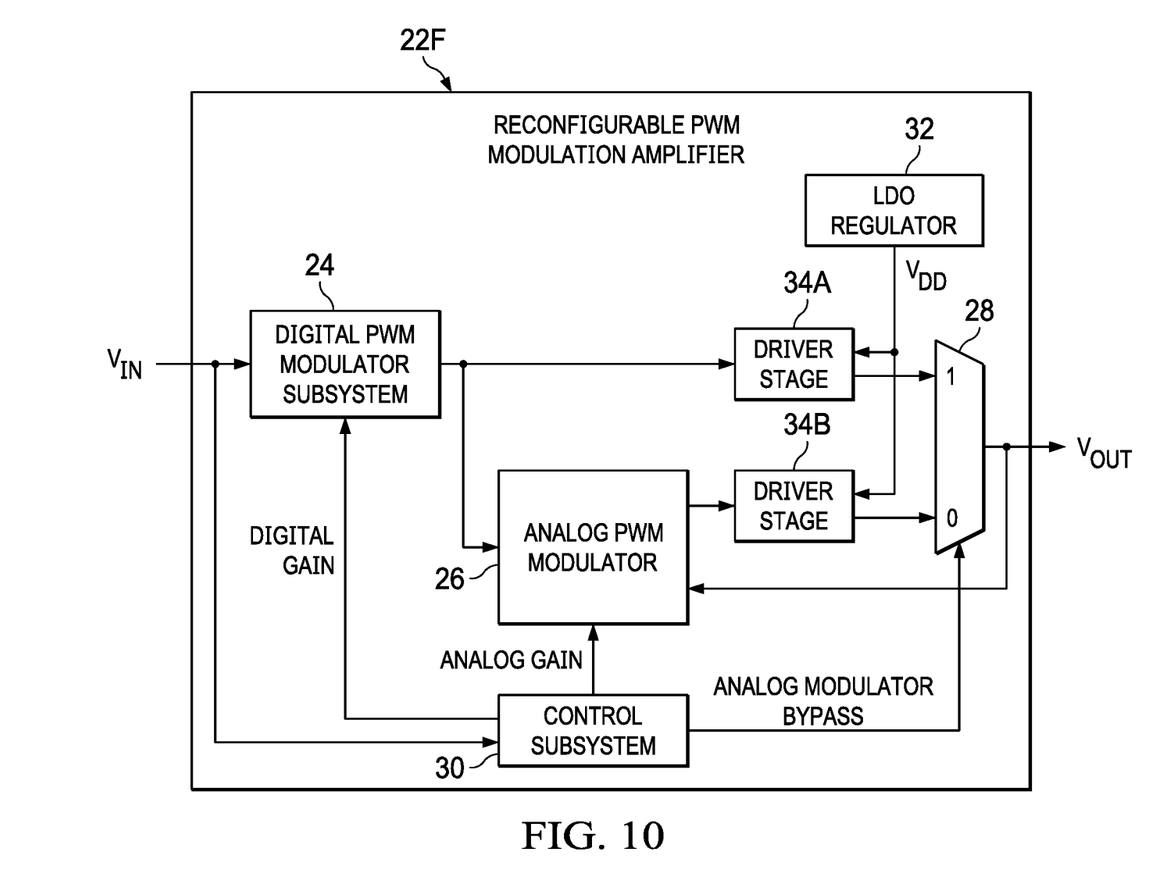
FIG. 10 is a block diagram of selected components of another reconfigurable PWM modulator, in accordance with embodiments of the present disclosure.

FIG. 10 is a block diagram of selected components of an example reconfigurable pulse width modulation amplifier 22F, in accordance with embodiments of the present disclosure. In some embodiments, example reconfigurable pulse width modulation amplifier 22F may be used to implement amplifier 16 of FIG. 2 and/or reconfigurable PWM amplifier 22 of FIG. 3. In some embodiments, reconfigurable PWM modulation amplifiers 22A-C shown in FIGS. 4-6 may be adapted in a manner consistent with reconfigurable PWM modulation amplifier 22F.

As shown in FIG. 10, example reconfigurable pulse width modulation amplifier 22F may include a digital PWM modulator subsystem 24 and an analog PWM modulator 26, along with a direct bypass function implemented with a multiplexer 28.

Reconfigurable PWM modulation amplifier 22F may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26. Also as shown in FIG. 10, an LDO regulator 32 may generate a supply voltage $V_{DD}$ that may supply electrical energy to driver stage 34B, such that driver stage 34B may use such electrical energy to generate output signal $V_{OUT}$.

Reconfigurable PWM modulation amplifier 22F may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24. Also as shown in FIG. 3, LDO regulator 32 may supply electrical energy via supply voltage $V_{DD}$ to driver stage 34A, such that driver stage 34A may use such electrical energy to generate output signal $V_{OUT}$.

Changing reconfigurable PWM modulation amplifier 22F from the analog closed-loop mode and the digital open-loop mode (and vice versa) may be achieved by, through use of multiplexer 28, selecting which of driver stage 34A and driver stage 34B is to drive output signal $V_{OUT}$. Although FIG. 10 and other figures herein depict, for the purposes of clarity and exposition, that the selection of which of driver stage 34A and driver stage 34B is to drive output signal $V_{OUT}$ is controlled by multiplexer 28, any other suitable system, device, or apparatus may be used to select between the output of driver stage 34A and driver stage 34B to generate output signal $V_{OUT}$ (e.g., tri-stated driver stages as shown in FIG. 7) whether or not such system, device, or apparatus is similar in structure and/or logical functionality as multiplexer 28.

In some embodiments, a control subsystem 30 may be used to control multiplexer 28 in order to select a signal processing path for reconfigurable PWM modulation amplifier 22F, for example by generating the ANALOG MODULATOR BYPASS control signal communicated from control subsystem 30 to multiplexer 28. For example, selection of such multiplexer control signal may be based on one or more characteristics of input signal $V_{IN}$ to the amplifier (e.g., signal magnitude, signal peak, signal envelope, signal frequency, or other characteristic of input signal $V_{IN}$). Thus, reconfigurable PWM modulation amplifier 22F may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal (e.g., signal magnitude, signal peak, signal envelope, signal frequency, or other characteristic of input signal $V_{IN}$). In embodiments in which input signal $V_{IN}$ is an audio signal, selection of the path for processing may be based not only on characteristics of the audio signal within an audible band of frequencies, but also the characteristics of out-of-band components of the signal that propagate to output signal $V_{OUT}$.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. However, the foregoing system may be susceptible to attenuation in the signal paths due to LDO regulator 32 being used as a power supply to driver stages 34A and 34B. Accordingly, control subsystem 30 may also be configured to control a digital gain of digital PWM modulator subsystem 24 using a control signal DIGITAL GAIN as shown in FIG. 3 and/or configured to control an analog gain of analog PWM modulator 26 using a control signal ANALOG GAIN as shown in FIG. 3, in order to compensate for an LDO attenuation of LDO regulator 32 and enhance a full signal range for reconfigurable PWM modulation amplifier 22F. Accordingly, the closed-loop path of reconfigurable PWM modulation amplifier 22F may have a digital gain (e.g., set by control signal DIGITAL GAIN) and an analog gain (e.g., set by control signal ANALOG GAIN) and the open-loop path of reconfigurable PWM modulation amplifier 22F may have a digital gain (e.g., set by control signal DIGITAL GAIN) and an analog gain (e.g., set by supply voltage $V_{DD}$). In some embodiments, control subsystem 30 may be configured to tune the digital gain set by control signal DIGITAL GAIN and the analog gain set by control signal ANALOG GAIN such that the product of the digital gain and the analog gain of the closed-loop path remains approximately equal to the product of the digital gain and the analog gain of the open-loop path.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a digital pulse width modulator subsystem;
   a first path coupled to an output of the digital pulse width modulator subsystem; and
   a second path coupled to the output of the digital pulse width modulator subsystem and configured to drive a closed-loop analog pulse width modulator, wherein one of the first path and the second path is selected for processing a signal based on one or more characteristics of the signal;
   wherein a first gain of the first path and a second gain of the second path are approximately equal at a time of switching selection between the first path and the second path or vice versa, in order to minimize artifacts due to the switching.

2. The system of claim 1, wherein:
   the first path comprises an open-loop driver stage;
   the second path comprises a closed-loop driver stage; and
   the system further comprises circuitry for selecting between the first path and the second path for processing the signal based on the one or more characteristics of the signal.

3. The system of claim 2, wherein the circuitry comprises a multiplexer.

4. The system of claim 2, wherein the circuitry comprises control circuitry for tri-stating at least one driver stage comprising the open-loop driver stage and the closed-loop driver stage in order to disable the at least one driver stage.

5. The system of claim 2, comprising:
   a first pre-driver interfaced between the digital pulse width modulator subsystem and the open-loop driver stage; and
   a second pre-driver interfaced between the closed-loop analog pulse width modulator and the closed-loop driver stage.

6. The system of claim 5, wherein the first pre-driver is powered from a first power supply and the open-loop driver stage is powered from a second power supply.

7. The system of claim 5, wherein the open-loop driver stage is powered from a low-voltage dropout regulator.

8. The system of claim 1, wherein the system further comprises:
circuitry for selecting between the first path and the second path for processing the signal based on the one or more characteristics of the signal; and
a driver stage common to both the first path and the second path and configured to drive an output signal based on the signal.

9. The system of claim 1, wherein the analog pulse width modulator comprises at least one integrator and a quantizer.

10. The system of claim 1, wherein the signal is an audio signal and the one or more characteristics comprise in-band audio content and out-of-band content of the signal which is delivered to an output of the system.

11. The system of claim 1, wherein the one or more characteristics comprise one or more of a signal magnitude of the signal, a frequency of the signal, power consumption of the system when processing the signal, and signal distortion of the signal.

12. The system of claim 1, wherein:
the first path has a first digital gain and a first analog gain;
the second path has a second digital gain and a second analog gain; and
the second digital gain and the second analog gain are controlled such that a product of the second digital gain and the second analog gain matches a product of the first digital gain and the first analog gain.

13. The system of claim 1, wherein a first frequency response of the first path and a second frequency response of the second path are approximately equal at a time of switching selection between the first path and the second path or vice versa, in order to minimize artifacts due to the switching.

14. The system of claim 1, wherein a first noise floor of the first path and a second noise floor of the second path are approximately equal at a time of switching selection between the first path and the second path or vice versa, in order to minimize artifacts due to the switching.

15. A method comprising, in a system comprising a digital pulse width modulator subsystem, a first path coupled to an output of the digital pulse width modulator subsystem, a second path coupled to the output of the digital pulse width modulator subsystem and configured to drive a closed-loop analog pulse width modulator, wherein one of the first path and the second path is selected for processing a signal based on one or more characteristics of the signal:
causing a first gain of the first path and a second gain of the second path in order that the first gain and the second gain to be approximately equal at a time of switching selection between the first path and the second path or vice versa, in order to minimize artifacts due to the switching.

16. The method of claim 15, further comprising aborting calibration of at least one of the first gain and the second gain if the second path is selected at any time during calibration.

17. The method of claim 15, wherein:
the first path comprises an open-loop driver stage; and
the second path comprises a closed-loop driver stage.

18. The method of claim 17, further comprising selecting between the first path and the second path for processing the signal using a multiplexer.

19. The method of claim 17, further comprising selecting between the first path and the second path for processing the signal by tri-stating at least one driver stage comprising the open-loop driver stage and the closed-loop driver stage in order to disable the at least one driver stage.

20. The method of claim 17, comprising:
pre-driving an output of the digital pulse width modulator subsystem with a first pre-driver interfaced between the digital pulse width modulator subsystem and the open-loop driver stage; and
pre-driving an output of the closed-loop analog pulse width modulator with a second pre-driver interfaced between the closed-loop analog pulse width modulator and the closed-loop driver stage.

21. The method of claim 20, further comprising powering the first pre-driver from a first power supply and powering the open-loop driver stage from a second power supply.

22. The method of claim 20, further comprising powering the open-loop driver from a low-voltage dropout regulator.

23. The method of claim 15, further comprising driving, with a driver stage common to both the first path and the second path, an output signal based on the signal.

24. The method of claim 15, wherein the closed-loop analog pulse width modulator comprises at least one integrator and a quantizer.

25. The method of claim 15, wherein the signal is an audio signal and the one or more characteristics comprise in-band audio content and out-of-band content of the signal which is delivered to an output of the system.

26. The method of claim 15, wherein the one or more characteristics comprise one or more of a signal magnitude of the signal, a frequency of the signal, power consumption of the system when processing the signal, and signal distortion of the signal.

27. The method of claim 15, wherein:
the first path has a first digital gain and a first analog gain;
the second path has a second digital gain and a second analog gain; and
the method further comprises controlling the second digital gain and the second analog gain such that a product of the second digital gain and the second analog gain matches a product of the first digital gain and the first analog gain.

28. The method of claim 15, wherein a first frequency response of the first path and a second frequency response of the second path are approximately equal at a time of switching selection between the first path and the second path or vice versa, in order to minimize artifacts due to the switching.

29. The method of claim 15, wherein a first noise floor of the first path and a second noise floor of the second path are approximately equal at a time of switching selection between the first path and the second path or vice versa, in order to minimize artifacts due to the switching.

* * * * *